United States Patent
He et al.

(10) Patent No.: US 9,928,797 B2
(45) Date of Patent: Mar. 27, 2018

(54) SHIFT REGISTER UNIT AND DRIVING METHOD THEREOF, GATE DRIVING APPARATUS AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiaoxiang He, Beijing (CN); Yin Deng, Beijing (CN); Dongmei Wei, Beijing (CN); Yang Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/517,415

(22) PCT Filed: Feb. 5, 2016

(86) PCT No.: PCT/CN2016/073625
§ 371 (c)(1),
(2) Date: Apr. 6, 2017

(87) PCT Pub. No.: WO2017/045346
PCT Pub. Date: Mar. 23, 2017

(65) Prior Publication Data
US 2017/0309243 A1    Oct. 26, 2017

(30) Foreign Application Priority Data
Sep. 16, 2015 (CN) .......................... 2015 1 0590964

(51) Int. Cl.
*G09G 3/36* (2006.01)
*G11C 19/28* (2006.01)

(52) U.S. Cl.
CPC ......... *G09G 3/3677* (2013.01); *G09G 3/3648* (2013.01); *G11C 19/28* (2013.01);
(Continued)

(58) Field of Classification Search
CPC ............... G09G 3/3677; G09G 3/3648; G09G 2310/0286; G11C 19/28
See application file for complete search history.

(56) References Cited

U.S. PATENT DOCUMENTS

| 2014/0037043 A1 | 2/2014 | Yoon | |
|---|---|---|---|
| 2014/0119493 A1* | 5/2014 | Yang | G11C 19/28 377/64 |
| 2014/0168044 A1* | 6/2014 | Hu | G09G 3/3696 345/90 |

FOREIGN PATENT DOCUMENTS

| CN | 103035298 A | 4/2013 |
|---|---|---|
| CN | 103226979 A | 7/2013 |

(Continued)

OTHER PUBLICATIONS

First Chinese Office Action dated Feb. 28, 2017; Appln. No. 201510590964.0.

(Continued)

*Primary Examiner* — Jennifer Mehmood
*Assistant Examiner* — Sardis F Azongha
(74) *Attorney, Agent, or Firm* — Ladas & Parry LLP (57) ABSTRACT

There are disclosed a shift register unit (100) and a driving method thereof, a gate driving apparatus and a display apparatus. The shift register unit (100) comprises a scanning direction selection unit (101), a control unit (102), a bootstrap unit (103), a first pull-down maintenance unit (104)

(Continued)

and a second pull-down maintenance unit (105), which are used to reduce electric stress of a part of elements in the shift register unit (100), so as to raise stability of operation and prolong service life. Additionally, it is capable of realizing a narrow frame design of a liquid crystal display. The gate driving apparatus can adopt the GOA technique to enhance integrity of the TFT-LCD panel.

16 Claims, 4 Drawing Sheets

(52) U.S. Cl.
CPC ............... *G09G 2300/0408* (2013.01); *G09G 2310/0286* (2013.01); *G09G 2310/0289* (2013.01); *G09G 2310/08* (2013.01); *G09G 2320/043* (2013.01)

(56) References Cited

FOREIGN PATENT DOCUMENTS

| | | | |
|---|---|---|---|
| CN | 103680453 | A | 3/2014 |
| CN | 104008742 | A | 8/2014 |
| CN | 105047174 | A | 11/2015 |
| KR | 1020110102627 | A | 9/2011 |

OTHER PUBLICATIONS

International Search Report and Written Opinion dated Jun. 23, 2016; PCT/CN2016/073625.

\* cited by examiner

SHIFT REGISTER UNIT AND DRIVING METHOD THEREOF, GATE DRIVING APPARATUS AND DISPLAY APPARATUS

TECHNICAL FIELD

The present disclosure relates to a shift register unit, a driving method thereof, a gate driving circuit and a display apparatus.

BACKGROUND

A thin film transistor display (TFT-LCD) is applicable widely to a variety of fields in production and life. When displaying is performed, the TFT-LCD drives respective pixels in the display panel through a driving circuit to display. The driving circuit of the TFT-LCD comprises mainly a gate driving circuit and a data driving circuit. Herein, the data driving circuit is configured to latch sequentially and timely input data according to a clock signal and inputs latched data to a data line of the display panel after converting the latched data into an analogy signal. The gate driving circuit is implemented generally through a shift register, which converts the clock signal into a turn-on/turn-off voltage to be output to respective gate lines of the display panel. One gate line on the display panel is usually connected to one shift register unit (i.e., one stage of a shift register). Progressive scanning of pixels in the display panel is realized by making respective shift register units output a turn-on voltage by turns and in order. Such progressive scanning of pixels can be divided into unidirectional scanning and bilateral scanning according to scanning directions. At present, in mobile products, it usually requires being capable of realizing bilateral scanning by taking into account of an increase of production capacity and yield rate of mobile products.

In other words, as the panel display develops, high resolution and narrow frame have become a trend. Due to such trend, technique of gate driver on array (GOA) emerges. The GOA technique integrates directly the gate driving circuit of the TFT-LCD on an array substrate to take place of a driving chip (IC) which is bonded on an outside edge of the panel and manufactured by a silicon chip. Since such technique can make the driving circuit on the array substrate directly, there is no need to bond IC and wirings around the panel, which reduces manufacturing processes of the panel, reduces cost of products, and at the same time improves integrity of the TFT-LCD panel, so that the panel realizes narrow frame and high resolution. However, the GOA technique has inherent problems such as service life or the like. In GOA design of actual products, how to use fewer circuit elements and devices to realize functions of shift registers and reduce electric stress of major TFTs to maintain the gate driving circuit to operate stably for a long time is a key problem of the GOA design.

SUMMARY

There are provided in the present disclosure a shift register unit and a driving method thereof, a gate driving apparatus and a display apparatus, which reduces electric stress of a part of major TFTs in the shift register unit and the gate driving apparatus, so that stability of operation is raised and service life is prolonged; additionally, fewer transistors are adopted in the shift register unit of embodiments of the present disclosure. Therefore, the embodiments of the present disclosure can realize a narrow frame design of a liquid crystal display. The gate driving apparatus according to the embodiments of the present disclosure can adopt the GOA technique to enhance integrity of the TFT-LCD panel.

According to one aspect of the present disclosure, there is provided a shift register unit, comprising:

a scanning direction selection unit, connected to a first power supply input terminal, a second power supply input terminal, a signal input terminal and a reset signal terminal and configured to provide an input signal of the signal input terminal under control of voltage input by the first power supply input terminal or provide an input signal of the reset signal terminal under control of voltage input by the second power supply input terminal to an output terminal of the scanning direction selection unit;

a control unit, whose input terminal is connected to the output terminal of the scanning direction selection unit, configured to provide a first output signal at a first output terminal of the control unit, a second output signal at a second output terminal of the control unit, and a third output signal at a third output terminal of the control unit according to a signal of the output terminal of the scanning direction selection unit, respectively;

a bootstrap unit, whose input terminal is connected to the first output terminal of the control unit, configured to output a signal at a signal output terminal of the shift register unit according to the first output signal of the first output terminal;

a first pull-down maintenance unit, whose first input terminal is connected to the second output terminal of the control unit and second input terminal is connected to the third output terminal of the control unit, configured to output a signal to the signal output terminal according to the second output signal of the second output terminal of the control unit and the third output signal of the third output terminal of the control unit;

a second pull-down maintenance unit, whose first input terminal is connected to the second output terminal of the control unit and second input terminal is connected to the third output terminal of the control unit, configured to output a signal to the signal output terminal according to the second output signal of the second output terminal of the control unit and the third output signal of the third output terminal of the control unit;

wherein the first pull-down maintenance unit and the second pull-down maintenance unit are used alternatively between two frames.

According to another aspect of the present disclosure, there is provide a gate driving apparatus, comprising a plurality of shift register units connected in series. Herein, except a first shift register unit and a last shift register unit of the plurality of shift register units connected in series, a signal output terminal of each of remaining shift register units is connected to a signal input terminal of an adjacent next shift register unit and a reset signal terminal of an adjacent previous shift register unit, a signal input terminal of the first shift register unit is input a frame start signal, and the signal output terminal is connected to a signal input terminal of the second shift register unit, and a signal output terminal of the last shift register unit is connected to a reset signal terminal of an adjacent previous shift register unit.

According to another aspect of the present disclosure, there is provided a display apparatus, comprising the gate driving apparatus described above.

According to another aspect of the present disclosure, there is provided a driving method of a shift register unit. The shift register unit comprises a scanning direction selection unit, a control unit, a bootstrap unit, a first pull-down maintenance unit and a second pull-down maintenance unit. For consecutive two-frame pictures, the method comprises: selecting a scanning direction through the scanning direction selection unit; making the second pull-down maintenance unit not operate during a period of a first frame and controlling the first pull-down maintenance unit to operate through the control unit; making the first pull-down maintenance unit not operate during a period of a second frame, and controlling the second pull-down maintenance unit to operate through the control unit.

DETAILED DESCRIPTION

Technical solutions in embodiments of the present disclosure will be described below clearly and completely by combining with figures in the embodiments of the present disclosure. Obviously, the embodiments described below are just a part of embodiments of the present disclosure, but not all the embodiments. Based on the embodiments in the present disclosure, all the other embodiments obtained by those ordinary skilled in the art without paying any inventive labor fall into a scope sought for protection in the present disclosure.

Transistors adopted in all the embodiments of the present disclosure can be thin film transistors or field effect transistors or other devices having same characteristics. In the present embodiment, connection manner of a drain and a source of each transistor can be exchanged with each other. Therefore, drains and sources of respective transistors in the embodiments of the present disclosure have no distinction. Herein, in order to distinguish two electrodes other than a gate of a transistor, one electrode of the transistor is called as a drain, and another electrode thereof is called as a source.

Figure 1:
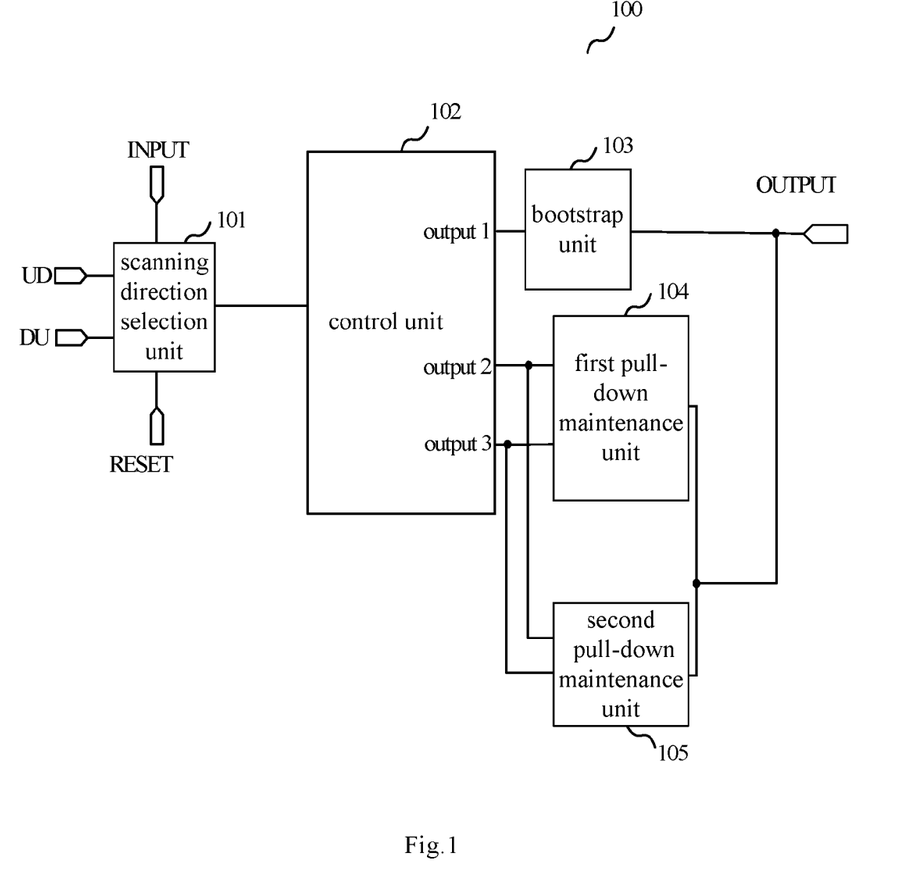
FIG. 1 shows a block diagram of circuit of a shift register unit according to an embodiment of the present disclosure.

FIG. 1 shows a block diagram of circuit of a shift register unit according to an embodiment of the present disclosure. As shown in FIG. 1, the shift register unit 100 comprises a scanning direction selection unit 101, a control unit 102, a bootstrap unit 103, a first pull-down maintenance unit 104 and a second pull-down maintenance unit 105.

The scanning direction selection unit 101 is connected to a first power supply input terminal UD, a second power supply input terminal DU, a signal input terminal INPUT and a reset signal terminal RESET, and configured to provide an input signal of the signal input terminal INPUT under control of voltage input by the first power supply input terminal DU or an input signal of the reset signal terminal RESET under control of voltage of the second power supply input terminal to an output terminal of the scanning direction selection unit.

An input terminal of the control unit 102 is connected to the output terminal of the scanning direction selection unit 101, and the control unit 102 is configured to provide a first output signal at a first output terminal output1 of the control unit 102, a second output signal at a second output terminal output2 of the control unit 102 and a third output signal at a third output terminal output3 of the control unit 102 according to a signal of the output terminal of the scanning direction selection unit 101, respectively.

An input terminal of the bootstrap unit 103 is connected to the first output terminal output1 of the control unit 102, and the bootstrap unit 103 is configured to output a signal at a signal output terminal OUTPUT of the shift register unit 100 according to the first output signal of the first output terminal output1.

A first input terminal of the first pull-down maintenance unit 104 is connected to the second output terminal output2 of the control unit 102, and a second input terminal thereof is connected to the third output terminal output3 of the control unit 102. The first pull-down maintenance unit 104 is configured to output a signal to the signal output terminal OUTPUT according to the second output signal of the second output terminal output2 of the control unit 102 and the third output signal of the third output signal output3 of the control unit 102.

A first input terminal of the second pull-down maintenance unit 105 is connected to the second output terminal output2 of the control unit 102, and a second input terminal thereof is connected to the third output terminal output3 of the control unit 102. The second pull-down maintenance unit 105 is configured to output a signal to the signal output terminal OUTPUT according to the second output signal of the second output terminal output2 of the control unit 102 and the third output signal of the third output terminal output3 of the control unit 102.

The first pull-down maintenance unit 104 and the second pull-down maintenance unit 105 are used alternatively between two frames.

Correspondingly, there is further disclosed in the embodiment of the present disclosure a driving method of a shift register unit. The shift register unit comprises a scanning direction selection unit, a control unit, a bootstrap unit, a first pull-down maintenance unit and a second pull-down maintenance unit. For two consecutive two-frame pictures, this method comprises:

selecting a scanning direction by a scanning direction selection unit;

during a period of a first frame, making the second pull-down maintenance unit not operate, and controlling the first pull-down maintenance unit to operate by the control unit;

during a period of a second frame, making the first pull-down maintenance unit not operate, and controlling the second pull-down maintenance unit to operate by the control unit;

The shift register unit according to the embodiment of the present disclosure share the scanning direction selection unit 101, the control unit 102, and the bootstrap unit 103 through two-frame pictures, and uses alternatively the first pull-down maintenance unit 104 and the second pull-down maintenance unit 105 between two frames, so that electric stress of a part of elements in a corresponding pull-down maintenance unit.

Figure 2:
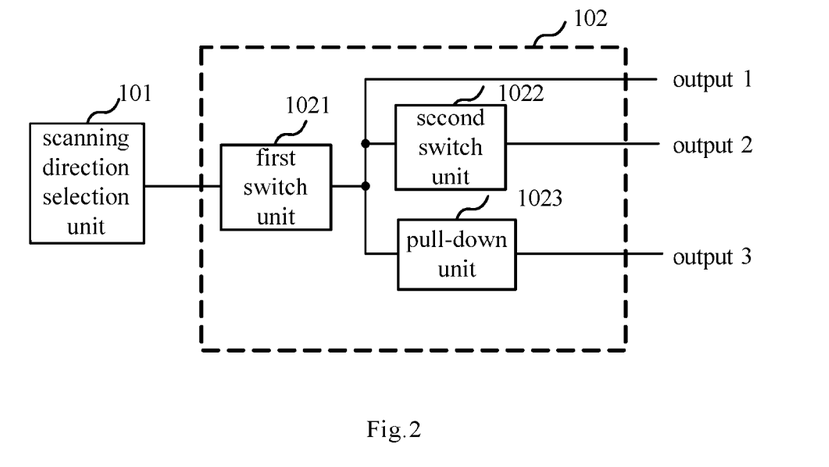
FIG. 2 shows a schematic diagram of internal circuit of a control unit in the shift register unit in FIG. 1.

FIG. 2 shows a schematic diagram of internal circuit of the control unit in the shift register unit of FIG. 1. As shown in FIG. 2, the control unit 102 comprises a first switch unit 1021, a second switch unit 1022 and a pull-down unit 1023.

An input terminal of the first switch unit 1021 is connected to the output terminal of the scanning direction selection unit 101. The first switch unit 1021 is configured to provide a first output signal to the first output terminal output1, the second switch unit 1022 and the pull-down unit 1023 of the control unit 102 according to a signal of the output terminal of the scanning direction selection unit 101.

An input terminal of the second switch unit 1022 is connected to an output terminal of the first switch unit 1021. The second switch unit 1022 is configured to provide a second output signal to the second output terminal output2 of the control unit 102 according to a first output signal of the output terminal of the first switch unit 1021.

An input terminal of the pull-down unit 1023 is connected to the output terminal of the first switch unit 1021. The pull-down unit 1023 is configured to provide a third output signal to the third output terminal of the control unit 102 according to the first output signal of the output terminal of the first switch unit 1021.

Figure 3:
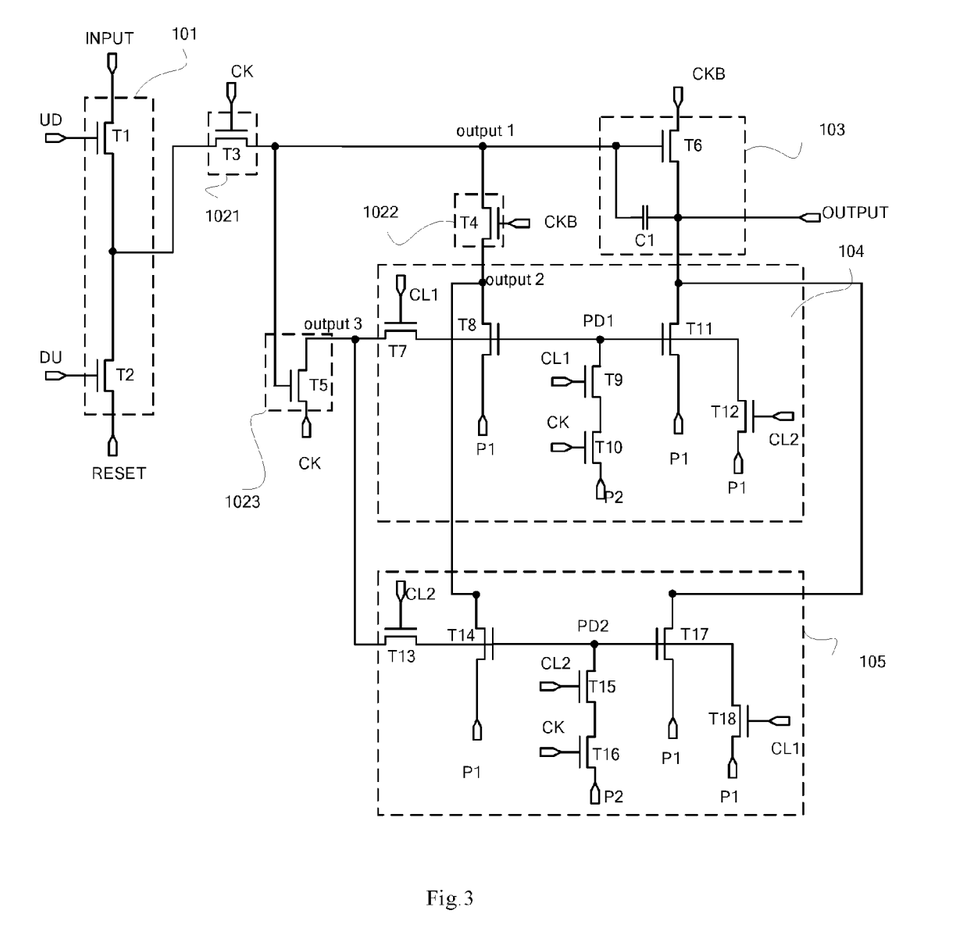
FIG. 3 shows a schematic diagram of a specific circuit structure of a shift register unit according to an embodiment of the present disclosure.

FIG. 3 shows a schematic diagram of a specific circuit structure of a shift register unit according to an embodiment of the present disclosure.

As shown in FIG. 3, the scanning direction selection unit 101 comprises a first transistor T1 and a second transistor 12. A gate of the first transistor T1 is connected to the first power supply input terminal UD, and a source thereof is connected to the signal input terminal INPUT; a gate of the second transistor T2 is connected to the second power supply input terminal DU, and a source thereof is connected to the reset signal terminal RESET; a drain of the first transistor T1 and a drain of the second transistor T2 are connected to each other to constitute the output terminal of the scanning direction selection unit 101.

The first switch unit 1021 comprises a third transistor T3, whose gate is connected to a first clock signal terminal CK, source is connected to the output terminal of the scanning direction selection unit 101, and drain, as the output terminal of the first switch unit 1021, connected to the first output terminal output1 of the control unit 102.

The second switch unit 1022 comprises a fourth transistor T4, whose gate is connected to a second clock signal terminal CKB, source is connected to the first output terminal output1 of the control unit 102, and drain, as the output terminal of the second switch unit 1022, connected to the second output terminal output2 of the control unit 102.

The pull-down unit 1023 comprises a fifth transistor T5, whose gate is connected to the first output terminal output1 of the control unit 102, source is connected to the first clock signal terminal CK, and drain, as the output terminal of the pull-down unit 1023, connected to the third output terminal output3 of the control unit 102.

The bootstrap unit 103 comprises a sixth transistor T6 and a first capacitor C1. A gate of the sixth transistor T6 is connected to the first output terminal output1 of the control unit 102, a source thereof is connected to the second clock signal terminal CKB, and a drain thereof is connected to the signal output terminal OUTPUT; one terminal of the first capacitor C1 is connected to the signal output terminal OUTPUT, another terminal thereof is connected to the first output terminal output1 of the control unit 102.

The first pull-down maintenance unit 104 comprises seventh to twelfth transistors T7 to T12. A gate of the seventh transistor T7 is connected to a first control signal terminal CL1, a source thereof is connected to the third output terminal output3 of the control unit 102, and a drain thereof is connected to a first node PD1; a gate of the eighth transistor T8 is connected to the first node PD1, a source thereof is connected to a third low voltage source P1, and a drain thereof is connected to the second output terminal output2 of the control unit 102; a gate of the ninth transistor T9 is connected to the first control signal terminal CL1, a source thereof is connected to a drain of the tenth transistor T10, and a drain thereof is connected to the first node PD1; a gate of the tenth transistor T10 is connected to the first clock signal terminal CK, a source thereof is connected to a fourth low voltage source P2; a gate of the seventh transistor T11 is connected to the first node PD1, a source thereof is connected to the third low voltage source P1, and a drain thereof is connected to the signal output terminal OUTPUT; a gate of the twelfth transistor T12 is connected to a second control signal terminal CL2, a source thereof is connected to the third low voltage source P1, and a drain thereof is connected to the first node PD1. The first pull-down maintenance unit 104 is configured to maintain the first node PD1 to be always at low level during a period of one frame under control of respective signals to reduce electric stress of the eighth transistor T8 and the eleventh transistor T11 in the first pull-down maintenance unit 104.

The second pull-down maintenance unit 105 comprises thirteenth to eighteenth transistors T13 to T18. A gate of the thirteenth transistor T13 is connected to the second control signal terminal CL2, a source thereof is connected to the third output terminal output3 of the control unit 102, and a drain thereof is connected to a second node PD2; a gate of the fourteen transistor T14 is connected to the second node PD2, a source thereof is connected to the third low voltage source P1, and a drain thereof is connected to the second output terminal output2 of the control unit 102; a gate of the fifth transistor T15 is connected to the second control signal terminal CL2, a source thereof is connected to a drain of the sixth transistor T16, and a drain thereof is connected to the second node PD2; a gate of the sixteenth transistor T16 is connected to the first clock signal terminal CK, a source thereof is connected to the fourth low voltage source P2; a gate of the seventh transistor T17 is connected to the second node PD2, and a source thereof is connected to the third low voltage source P1, and a drain thereof is connected to the signal output terminal OUTPUT; a gate of the eighth transistor T18 is connected to the first control signal terminal CL1, a source thereof is connected to the third low voltage source P1, and a drain thereof is connected to the second node PD2. The second pull-down maintenance unit 105 is configured to maintain the second PD2 to be always at low level during the period of one frame under control of respective signals to reduce electric stress of the fourteenth transistor T14 and the seventeenth transistor T17 in the second pull-down maintenance unit 105.

The shift register unit according to the embodiment of the present disclosure share the scanning direction selection unit 101, the control unit 102, and the bootstrap unit 103 through the two-frame pictures, uses alternatively the first pull-down maintenance unit 104 and the second pull-down maintenance unit 105 between two frames, and avoids the node PD (PD1 or PD2) from being always in an operation state, and thus the shift register unit according to the embodiment of the present disclosure can reduce electric stress of a part of major TFTs in a corresponding pull-down maintenance circuit.

A clock signal of the second clock signal terminal CKB of the shift register unit and a clock signal of the first clock signal CK thereof have phases opposite to each other.

It could be understood that the illustrated circuit structure of the scanning direction selection unit 101, the control unit 102, the bootstrap unit 103, the first pull-down maintenance unit 104 and the second pull-down maintenance unit 105 as shown in FIG. 3 is just an example. Respective units can also adopt other appropriate circuit structures only if their respective functions can be realized, to which the present disclosure does not limit.

Figure 4:
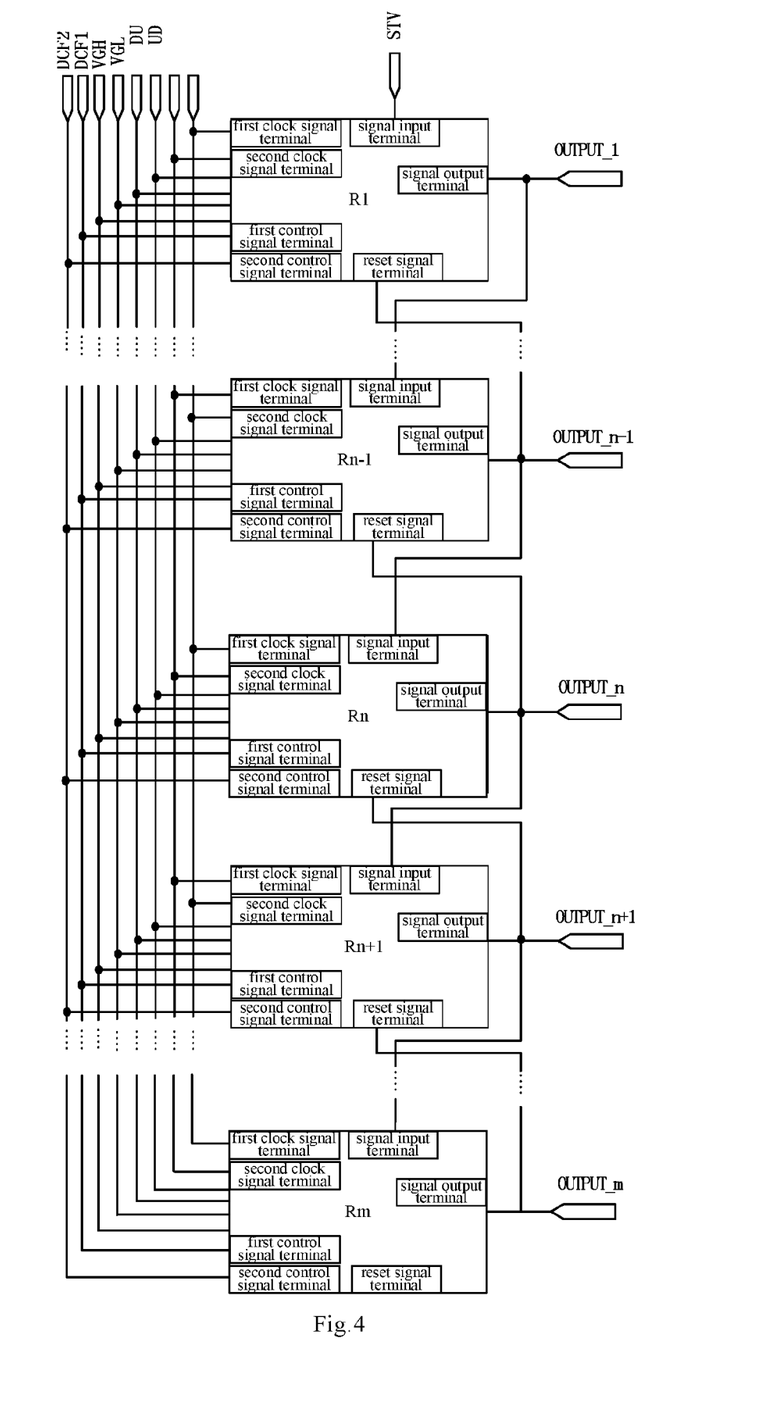
FIG. 4 shows a schematic diagram of a gate driving apparatus formed by a plurality of shift register units according to an embodiment of the present disclosure.

FIG. 4 shows a schematic diagram of a gate driving apparatus formed by a plurality of the shift register units 100 connected in cascades according to an embodiment of the present disclosure.

As shown in FIG. 4, in the gate driving apparatus, the plurality of shift register units 100 are connected in series, wherein except a first shift register unit R1 and a last shift register unit Rm, a signal output terminal OUTPUT of each of remaining shift register units Rn (1<n<m) is connected to a signal input terminal INPUT of an adjacent next shift register unit Rn+1 and a reset signal terminal RESET of an adjacent previous shift register unit Rn−1; the signal input terminal INPUT of the first shift register unit R1 is input a frame start signal STV, and the signal output terminal OUTPUT thereof is connected to a signal input terminal INPUT of the second shift register unit R2; a signal output terminal OUTPUT of the last shift register unit Rm is connected to a reset signal terminal RESET of an adjacent previous shift register unit Rm−1. OUTPUT_n is an output signal of an n-th stage of shift register unit.

Additionally, as shown in FIG. 4, in the gate driving apparatus, clock signals input by first clock signal terminals of two adjacent stages of shift register units have phases opposite to each other, and clock signals input by second clock signal terminals of two adjacent stages of shift register units have phases opposite to each other. For example, a first clock signal terminal of the shift register unit Rn is input a CLK signal, a second clock signal terminal CLKB thereof is input a CLKB signal; a first clock signal terminal of the shift register unit Rn+1 is input the CLKB signal, and a second clock signal terminal thereof is input the CLK signal, wherein the CLK signal and the CLKB signal have phases opposite to each other.

Additionally, DCF1 and DCF2 are control signals output by the first control signal terminal CL1 and the second control signal terminal CL2, and both of them are direct current signals within one frame. VGL and VGH are voltage signals output by the third low voltage source P1 and the fourth low voltage source P2.

Figure 5:
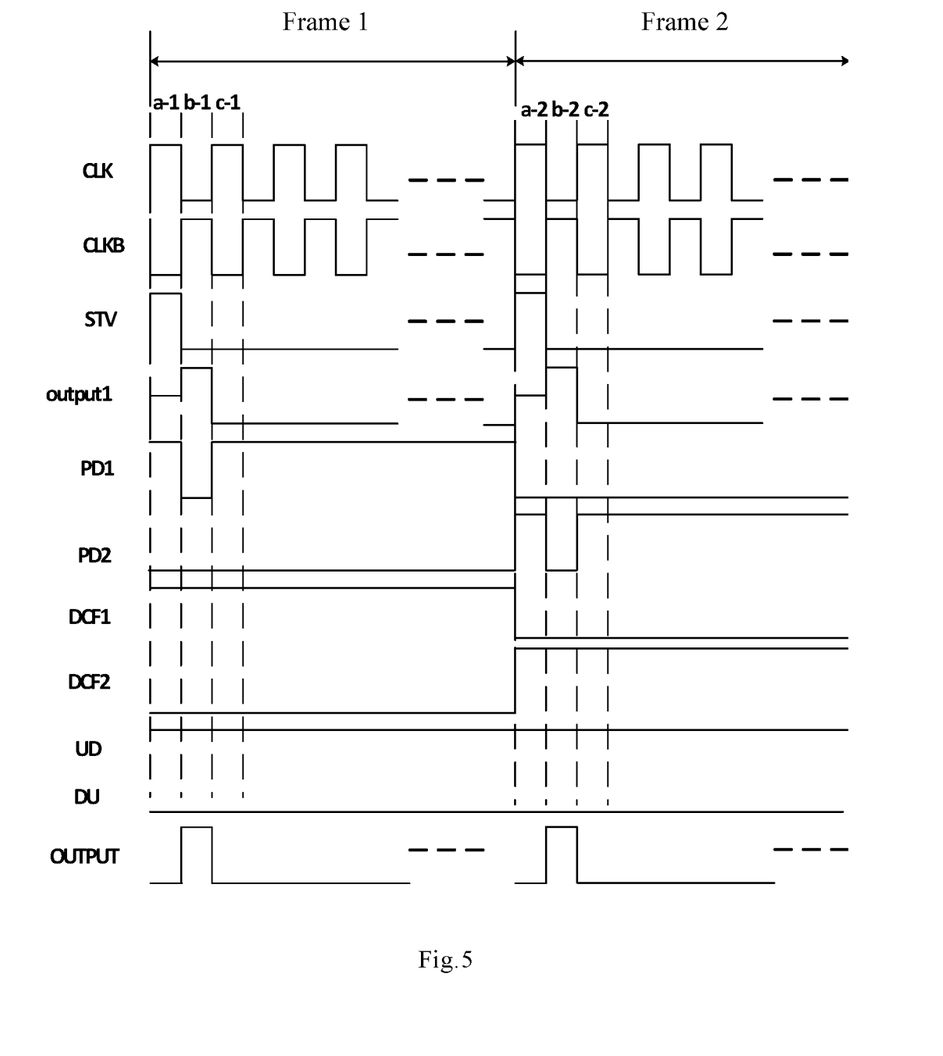
FIG. 5 shows a timing diagram when a shift register unit according to an embodiment of the present disclosure performs forward scanning.

FIG. 5 shows a timing diagram when a shift register unit according to an embodiment of the present disclosure performs forward scanning. The specific operation process of the shift register unit 100 according to the embodiment of the present disclosure will be described below by referring to FIG. 5. Descriptions are provided below by taking the transistors being N type transistors as an example.

At first, it needs to specify that the shift register unit 100 according to the embodiment of the present disclosure is capable of performing bilateral scanning. Herein, when forward scanning and backward scanning are performed, the structure of the shift register unit does not make any change, only that functions of the signal input terminal and the reset signal terminal changes. For example, when forward scanning is performed, a high level signal VDD is input from the first power supply input terminal UD, and a low level signal VSS is input from the second power supply input terminal DU; when backward scanning is performed, the low level signal VSS is input from the first power supply input terminal UD, and the high level signal VDD is input from the second power supply input terminal DU. The signal input terminal INPUT when forward scanning is performed is used as the reset signal terminal RESET when backward scanning is performed, while the reset signal terminal RESET when forward scanning is performed is used as the signal input terminal INUT when backward scanning is performed.

Firstly, operation process when the shift register unit according to the embodiment of the present disclosure when forward scanning is performed is described by combining with the timing diagram when forward scanning is performed as shown in FIG. 5. In the process of forward scanning, the high level signal VDD is input from the first power supply input terminal UD, and the first transistor T1 maintains turned on; the low level signal VSS is input from the second power supply input terminal DU, and the second transistor T2 maintains turned off. For consecutive two-frame pictures, this operation comprises following several steps.

During the period of one frame, the first pull-down maintenance unit 104 operates, the control signal DCF2 input by the second control signal terminal CL2 is a low level, and the twelfth transistor T12 is turned off, which does not influence the potential of the first node PD1; the second pull-down maintenance unit 105 does not operate, the control signal DCF1 output by the first control signal terminal CL1 is a high level, the eighteenth transistor T18 is always turned on, and thus the second node PD2 is always at the low level, thereby reducing electric stress of the fourteenth transistor T14 and the seventeenth transistor T17 in the second pull-down maintenance unit 105.

As shown in FIG. 5, this operation process can be subdivided into several phases during the period of the first frame.

First phase a-1: the shift register unit is made to output the low level signal through the control unit and the bootstrap unit. The high level signal VDD is input from the first power supply input terminal UD, and the first transistor T1 is turned on in response to the input signal at high level. The signal input terminal INPUT of the shift register unit (Rn) is input a high level signal, wherein the input signal of the signal input terminal INPUT is a output signal of a signal output terminal of a previous stage of shift register unit (Rn−1) (the signal input terminal INPUT of the first shift register unit R1 is input the frame start signal STV). At this time, the clock signal CLK of the first clock signal terminal CK is a high level, the third transistor T3 is turned on, a high level input signal of the signal input terminal INPUT is input from the third transistor T3 to charge the first capacitor C1. Now, the first output terminal output1 of the control unit 102 is at high level. At the same time, the fourth transistor T4 is turned on, and voltage of the clock signal CLK of the first clock signal terminal CK is output to the third output terminal output3 of the control unit 102 through the fourth transistor T4. Since a control signal DCF1 output by the first control signal terminal CL1 is the high level, the seventh transistor T7 and the ninth transistor T9 are turned on. The high level at the third output terminal output3 charges the first node PD1 to the high level through the seventh transistor T7. The clock signal CLK of the first clock signal terminal CK is the high level, and thus the tenth transistor T10 is turned on, a voltage signal VGH output by the fourth low voltage source P2 is transmitted to the first node PD1, the eleventh transistor T11 is turned on, and a potential of the signal output terminal OUTPUT is pulled to a low level output by the third low voltage source P1. Since the first output terminal output1 of the control unit 102 is at high level, the sixth transistor T6 is turned on, the clock signal CLKB of the second clock signal terminal CKB is the low level, and thus the signal output terminal OUTPUT outputs a low level signal. Since the first node PD1 is at high level, the eighth transistor T8 is turned on, and a potential of the second output terminal output2 of the control unit 102 is pulled to the low level output by the third low voltage source P1. Since the clock signal CLKB of the second clock signal terminal CKB is at low level, the fourth transistor T4 is turned off, to prevent the potential of the first output terminal output1 from being pulled down. Since the control signal DCF1 output by the first control signal terminal CL1 is the high level, the eighteenth transistor T18 is turned on, and the potential of the second node PD2 is pulled to the low level output by the third low voltage source P1. Since the control signal DCF2 output by the second control signal terminal CL2 is the low level, the twelfth transistor T12 is turned off.

Second phase b-1: the shift register is made to output a high level signal through the control unit and the bootstrap unit. The signal input terminal INPUT of the shift register unit (Rn) is input a low level signal, wherein an input signal of the signal input terminal INPUT is an output signal of the signal output terminal OUTPUT of a previous stage of shift register unit (Rn−1) (the signal input terminal INPUT of the first stage of shift register unit R1 is input the frame start signal STV). The clock signal CLK of the first clock signal terminal CK is the low level, the third transistor T3 is turned off, the clock signal CLKB of the second clock signal terminal CKB is a high level, and the potential of the first output terminal output1 is latched as the high level. Additionally, since the first output terminal output1 is the high level, the sixth transistor T6 is turned on, the clock signal CLKB of the second clock signal terminal CKB is a high level, and the potential of the first output terminal output1 is further pulled up according to a charge maintenance principle of the first capacitor C1. The clock signal CLK of the first clock signal terminal CK is a low level, and thus the tenth transistor T10 is turned off, and the voltage signal VGH output by the fourth low voltage source P2 cannot be transmitted to the first node PD1. Since the first output terminal output1 is at high level, the fifth transistor T5 is turned on. Further, the control signal DCF1 output by the first control signal terminal CL1 is a high level and the seventh transistor T7 is turned on, and thus the low level clock signal CLK of the first clock signal terminal CK pulls down the potential of the first node PD1 to the low level via the fifth transistor T5 and the seventh transistor T7, so that the eighth transistor T8 and the eleventh transistor T11 are turned off, which does not influence output of the signal output terminal OUTPUT. The potential of the first output terminal output is a high level, and thus the sixth transistor T6 is turned on, and the clock signal CLKB of the second clock signal terminal CKB is a high level, and thus the signal output terminal OUTPUT outputs the high level signal.

Third phase c-1: the shift register unit is made to output the low level signal through the control unit and the bootstrap unit. The signal input terminal INPUT of the shift register unit (Rn) is input the low level signal, wherein the input signal of the signal input terminal INPUT is the output signal of the signal output terminal OUTPUT of the previous stage of shift register unit (Rn−1) (the signal input terminal INPUT of the first shift register nit R1 is input the frame start signal STV). The clock signal CLK of the first clock signal terminal CK is a high level, the third transistor T3 is turned on, the low level signal of the signal input terminal INPUT pulls down the first output terminal output1 to the low level via the third transistor T3, and the fifth transistor T5 and the sixth transistor T6 are turned off. Since the control signal DCF1 output by the first control signal terminal CL1 is a high level, the clock signal CLK of the first clock signal terminal CK is a high level, and thus the ninth transistor T9 and the tenth transistor T10 are turned on, respectively, and the high voltage signal VGH output by the fourth low voltage source P2 is transmitted to the first node PD1, the eleventh transistor T11 is turned on, and the potential of the signal output terminal OUTPUT is pulled to the low level output by the third low voltage source P1. At the same time, the eighth transistor T8 is turned on, and the potential of the second output terminal output2 of the control unit 102 is pulled to the low level output by the third voltage source P1.

After the third phase, the shift register unit is made to output constantly the low level signal through the control unit and the bootstrap unit until a next frame comes. Herein, the clock signal CLKB of the second clock signal terminal CKB and the clock signal CLK of the first clock signal terminal CK are continuously input high and low level signals alternatively, and other input signal and output signals maintains unchanged until the next frame comes. After having received the high level signal of the signal input terminal INPUT, the shift register unit re-performs the above respective phases.

During the period of the second frame, the second pull-down maintenance unit 105 operates, the control signal DCF1 output by the first control signal terminal CL1 is a low level, and the eighteenth transistor T18 is turned off, which does not influence the potential of the second node PD2; the first pull-down maintenance unit 104 does not operate, the control signal DCF2 output by the second control signal terminal CL2 is a high level, the twelfth transistor 12 is always turned on, and thus the first node PD1 is always at low level, so that electric stress of the eighth transistor T8 and the eleventh transistor T11 in the first pull-down maintenance unit 104 is reduced.

Timing principles in a first phase a-2, a second phase b-2 and a third phase c-2 during the period of the second frame are similar to corresponding phases during the period of the first frame. Except that during the period of the second frame, the control signal output by the first control signal terminal CL1 is a low level, the control signal output by the second control signal terminal CL2 is a high level, a voltage curve of the first node PD1 during the period of the second frame is the same as a voltage curve of the second node PD2 during the period of the first frame, and a voltage curve of the second node PD2 during the period of the second frame is the same as a voltage curve of the first node PD1 during the period of the first frame, other input signals and output signals during the period of the second frame are the same as corresponding signals during the period of the first frame. Thus, no further description is given herein.

It can be seen from the above description that the shift register unit according to the embodiment of the present disclosure share the scanning direction selection unit 101, the control unit 102, and the bootstrap unit 103 through two-frame pictures, and use alternatively the first pull-down maintenance unit 104 and the second pull-down maintenance unit 105 between two frames, which avoids the node PD (PD1 or PD2) from being always in a certain operation state, and thus electric stress of a part of major TFTs (T8, T11, T14, T17) in the corresponding pull-down maintenance unit can be reduced, so that stability of operation is raised, and service life is prolonged; at the same time, the shift register unit according to the embodiment of the present disclosure adopts fewer transistors, so that it is capable of realizing a design of narrow frame of the liquid crystal display.

The gate driving apparatus according to the embodiment of the present disclosure can adopt GOA technique to be used as the gate driving circuit of the display apparatus, so as to provide a function of scanning progressively to transmit a scanning signal to a display region.

There is further provided in the present disclosure a display apparatus comprising the gate driving apparatus described above.

The display apparatus herein can be any product or means having a display function, such as an electronic paper, a mobile phone, a panel computer, a television set, a display, a notebook computer, a digital photo frame, and a navigator or the like.

The above descriptions are just specific implementations of the present disclosure. However, the protection scope of the present disclosure is not limited thereto. Any alternation or replacement that can be easily conceived by those skilled in the art who are familiar with the technical field within the technical scope of the present disclosure shall be covered within the protection scope of the present disclosure. Therefore, the protection scope of the present disclosure shall be subjected to the protection scope of the Claims.

The present application claims the priority of a Chinese patent application No. 201510590964.0 filed on Sep. 16, 2015. Herein, the content disclosed by the Chinese patent application is incorporated in full by reference as a part of the present disclosure.

What is claimed is:

1. A shift register unit, comprising:
   a scanning direction selection unit, connected to a first power supply input terminal, a second power supply input terminal, a signal input terminal and a reset signal terminal, and configured to provide an input signal of the signal input terminal under control of voltage input by the first power supply input terminal or provide an input signal of the reset signal terminal under control of voltage input by the second power supply input terminal to an output terminal of the scanning direction selection unit;
   a control unit, whose input terminal is connected to the output terminal of the scanning direction selection unit, configured to provide a first output signal at a first output terminal of the control unit, a second output signal at a second output terminal of the control unit, and a third output signal at a third output terminal of the control unit according to a signal of the output terminal of the scanning direction selection unit, respectively;
   a bootstrap unit, whose input terminal is connected to the first output terminal of the control unit, configured to output a signal at a signal output terminal of the shift register unit according to the first output signal of the first output terminal;
   a first pull-down maintenance unit, whose first input terminal is connected to the second output terminal of the control unit and second input terminal is connected to the third output terminal of the control unit, configured to output a signal to the signal output terminal according to the second output signal of the second output terminal of the control unit and the third output signal of the third output terminal of the control unit;
   a second pull-down maintenance unit, whose first input terminal is connected to the second output terminal of the control unit and second input terminal is connected to the third output terminal of the control unit, configured to output a signal to the signal output terminal according to the second output signal of the second output terminal of the control unit and the third output signal of the third output terminal of the control unit;
   wherein the first pull-down maintenance unit and the second pull-down maintenance unit are used alternatively between two frames.

2. The shift register unit according to claim 1, wherein the control unit comprises:
   a first switch unit, whose input terminal is connected to the output terminal of the scanning direction selection unit, configured to provide the first output signal to the first output terminal, the second switch unit and the pull-down unit of the control unit according to the signal of the output terminal of the scanning direction selection unit;
   a second switch unit, whose input terminal is connected to an output terminal of the first switch unit, configured to provide a second output signal to the second output terminal output of the control unit according to the first output signal of the output terminal of the first switch unit;
   a pull-down unit, whose input terminal is connected to the output terminal of the first switch unit, configured to provide the third output signal to the third output terminal of the control unit according to the first output signal of the output terminal of the first switch unit.

3. The shift register unit according to claim 2, wherein
   the first switch unit comprises a third transistor, whose gate is connected to a first clock signal terminal, source is connected to the output terminal of the scanning direction selection unit, and drain, as an output terminal of the first switch unit, is connected to the first output terminal of the control unit;
   the second switch unit comprises a fourth transistor, whose gate is connected to a second clock signal terminal, source is connected to the first output terminal of the control unit, and drain, as an output terminal of the second switch unit, is connected to the second output terminal of the control unit; and
   the pull-down unit comprises a fifth transistor, whose gate is connected to the first output terminal of the control unit, source is connected to the first clock signal terminal, and drain, as an output terminal of the pull-down unit, is connected to the third output terminal of the control unit.

4. The shift register unit according to claim 1, wherein the scanning direction selection unit comprises:
   a first transistor, whose gate is connected to the first power supply input terminal, and source is connected to the signal input terminal;
   a second transistor, whose gate is connected to the second power supply input terminal, and source is connected to the reset signal terminal;
   wherein drain of the first transistor and drain of the second transistor are connected to each other to form the output terminal of the scanning direction selection nit.

5. The shift register unit according to claim 1, wherein the bootstrap unit comprises:
   a sixth transistor, whose gate is connected to the first output terminal of the control unit, source is connected to the second clock signal terminal, and drain is connected to a signal output terminal;
   a first capacitor, whose one terminal is connected to the signal output terminal, and another terminal is connected to the first output terminal of the control unit.

6. The shift register unit according to claim 1, wherein the first pull-down maintenance unit comprises:

a seventh transistor, whose gate is connected to a first control signal terminal, source is connected to the third output terminal of the control unit, and drain is connected to a first node;

an eighth transistor, whose gate is connected to the first node, source is connected to a third low voltage source, and drain is connected to the second output terminal of the control unit;

a ninth transistor, whose gate is connected to the first control signal terminal, source is connected to a drain of a tenth transistor, and drain is connected to the first node;

the tenth transistor, whose gate is connected to the first clock signal terminal, and source is connected to a fourth low voltage source;

an eleventh transistor, whose gate is connected to the first node, source is connected to the third low voltage source, and drain is connected to the signal output terminal; and a twelfth transistor, whose gate is connected to a second control signal terminal, source is connected to a third low voltage source, and drain is connected to the first node.

7. The shift register unit according to claim 1, wherein the second pull-down maintenance unit comprises:

a thirteenth transistor, whose gate is connected to the second control signal terminal, source is connected to the third output terminal of the control unit, and drain is connected to a second node;

a fourteenth transistor, whose gate is connected to the second node, source is connected to the third low voltage source, and drain is connected to the second output terminal of the control unit;

a fifteenth transistor, whose gate is connected to the second control signal terminal, source is connected to a drain of a sixteenth transistor, and drain is connected to the second node;

the sixteenth transistor, whose gate is connected to the first clock signal terminal, and source is connected to the fourth low voltage source;

a seventeenth transistor, whose gate is connected to the second node, source is connected to the third low voltage source, and drain is connected to the signal output terminal;

an eighteenth transistor, whose gate is connected to the first control signal terminal, source is connected to the third low voltage source, and drain is connected to the second node.

8. The shift register unit according to claim 1, wherein inputting a high level signal from the first power supply input terminal and inputting a low level signal from the second power supply input terminal when forward scanning is performed;

inputting the low level signal from the first power supply input terminal and inputting the high level signal from the second power supply input terminal when backward scanning is performed;

wherein a signal input terminal when forward scanning is performed is used as a reset signal terminal when backward scanning is performed, and a reset signal terminal when forward scanning is performed is used as a signal input terminal when backward scanning is performed.

9. The shift register unit according to claim 1, wherein a clock signal of a second clock signal terminal of the shift register unit and a clock signal of a first clock signal terminal thereof have phases is opposite to each other.

10. A gate driving apparatus, comprising a plurality of shift register units connected in series, each of which is the shift register unit according to claim 1, wherein except a first shift register unit and a last shift register unit of the plurality of shift register units connected in series, a signal output terminal of each of remaining shift register units is connected to a signal input terminal of an adjacent next shift register unit and a reset signal terminal of an adjacent previous shift register unit, a signal input terminal of the first shift register unit is input a frame start signal, and the signal output terminal is connected to a signal input terminal of the second shift register unit, and a signal output terminal of the last shift register is connected to a reset signal terminal of an adjacent previous shift register.

11. The gate driving apparatus according to claim 10, wherein clock signals input by first clock signal terminals of adjacent two stages of shift register units have phases opposite to each other, and clock signals input by second clock signal terminals thereof have phases opposite to each other.

12. The gate driving apparatus according to claim 10, wherein the gate driving apparatus is a gate driving apparatus that adopts GOA.

13. A display apparatus, comprising the gate driving apparatus according to claim 10.

14. A driving method of a shift register unit according to claim 1, the method comprising:

selecting a scanning direction by the scanning direction selection unit;

during a period of a first frame of two consecutive frame pictures, making the second pull-down maintenance unit not operate, and controlling the second pull-down maintenance unit to operate by the control unit;

during a period of a second frame of the two consecutive frame pictures, making the first pull-down maintenance unit not operate, and controlling the second pull-down maintenance to operate by the control unit.

15. The driving method according to claim 14, wherein during the period of the first frame, the method comprises:

in a first phase, making the shift register unit output a low level signal by the control unit and the bootstrap unit;

in a second phase, making, the shift register unit output a high level signal by the control unit and the bootstrap unit;

in a third phase, making the shift register unit output the low level signal by the control unit and the bootstrap unit; and after the third phase, making the shift register unit output constantly the low level signal by the control unit and the bootstrap unit until a next frame comes.

16. The driving method according to claim 14, wherein during the period of the second frame, the method comprises:

in the first phase, making the shift register output the low level signal by the control unit and the bootstrap unit;

in the second phase, making the shift register unit output the high level signal by the control unit and the bootstrap unit;

in the third phase, making, by the control unit and the bootstrap unit, the shift register unit output the low level signal; and after the third phase, making, the shift register unit output constantly the low level signal by the control unit and the bootstrap unit until the next frame comes.

* * * * *